United States Patent
Smith et al.

(10) Patent No.: US 7,250,899 B2
(45) Date of Patent: Jul. 31, 2007

(54) GPS RECEIVER WITH IMPROVED IMMUNITY TO COLLOCATED TRANSMISSIONS AND METHOD THEREFOR

(75) Inventors: Howard James Smith, Bishop's Stortford (GB); Stefan Fulga, Ottawa (CA); Paul Wallis, Ottawa (CA)

(73) Assignee: SiGe Semiconductor (Europe) Limited, Bishop's Stortford (GB)

( * ) Notice: Subject to any disclaimer, the term of this patent is extended or adjusted under 35 U.S.C. 154(b) by 107 days.

(21) Appl. No.: 11/172,947

(22) Filed: Jul. 5, 2005

(65) Prior Publication Data

US 2007/0008215 A1 Jan. 11, 2007

(51) Int. Cl.
*G01S 7/36* (2006.01)
(52) U.S. Cl. .................... 342/19; 342/357.12
(58) Field of Classification Search ............ 342/17, 342/19, 357.06, 357.12
See application file for complete search history.

(56) References Cited

U.S. PATENT DOCUMENTS

| | | | | |
|---|---|---|---|---|
| 3,772,702 A | * | 11/1973 | Nielsen | 342/19 |
| 5,722,063 A | * | 2/1998 | Peterzell et al. | 455/287 |
| 5,732,341 A | * | 3/1998 | Wheatley, III | 455/234.1 |
| 5,983,160 A | * | 11/1999 | Horslund et al. | 701/213 |
| 6,229,998 B1 | * | 5/2001 | Hamdy et al. | 455/226.1 |
| 6,498,819 B1 | * | 12/2002 | Martin | 375/345 |
| 6,670,914 B1 | * | 12/2003 | Najarian et al. | 342/357.06 |
| 6,947,840 B2 | * | 9/2005 | Fielder | 701/214 |
| 2003/0181178 A1 | * | 9/2003 | Zerod et al. | 455/232.1 |
| 2005/0101277 A1 | * | 5/2005 | Narayan et al. | 455/232.1 |
| 2006/0125688 A1 | | 6/2006 | Henderson et al. | 342/379 |
| 2007/0008215 A1 | * | 1/2007 | Smith et al. | 342/357.02 |

* cited by examiner

*Primary Examiner*—Thomas H. Tarcza
*Assistant Examiner*—Shelley Chen
(74) *Attorney, Agent, or Firm*—Kenyon & Kenyon LLP (57) ABSTRACT

A method and apparatus for limiting the effect of interfering transmission on a Global Positioning System (GPS) receiver is disclosed. A first mode of operation of the GPS receiver is provided wherein the AGC of the receiver is operated in a linear state. A second mode of operation of the GPS receiver is provided wherein the AGC of the receiver is operated in a non-linear state. A first signal is provided indicating a presence of a jamming signal. In response to the first signal the GPS receiver is switched from the first mode of operation to the second mode of operation.

36 Claims, 7 Drawing Sheets

GPS RECEIVER WITH IMPROVED IMMUNITY TO COLLOCATED TRANSMISSIONS AND METHOD THEREFOR

FIELD OF THE INVENTION

The invention relates to the field of spread spectrum communication, and, in particular, to an improved GPS receiver in close proximity to a radio frequency transmitter including those of mobile handsets.

BACKGROUND OF THE INVENTION

The basic functionality of a Global Positioning System (GPS) receiver is to calculate the latitude, longitude and altitude of the GPS receiver's location (i.e. the co-ordinates of the receiver) upon receiving a number of GPS signals from a network of GPS satellites that orbit the earth. The calculation of the co-ordinates of the GPS receiver typically begins by comparing the timing associated with a select number of received GPS signals. After the initial comparison of the received GPS signals, values for timing corrections associated with the select group of received GPS signals are established. The timing corrections are made in order to solve a three-dimensional geometric problem, which has as its solution the co-ordinates of the GPS receiver.

The received GPS signals are typically weak and thus easily interfered with by other radio transmissions in the same or adjacent frequency bands. Interference can be especially problematic when the GPS receiver is co-located with a communications device that includes a radio transmitter such as a cellular telephone. The transmitted signal from the co-located communication device can overload or saturate the GPS receiver front-end designed to receive weak GPS signals. In such a situation, no useful information can be extracted from the received GPS signals originating from the GPS satellites.

One known method of overcoming this problem is by filtering all of the received signals from the GPS antenna before down conversion of the respective transmission signal band by the GPS receiver front-end. Typically a low noise amplifier (LNA) is first used to amplify the signal before further filtering or mixing to another frequency. The result of adopting this approach is that the loss of all signal energies in the filter reduces the sensitivity of the GPS receiver permanently, irrespective of whether or not the co-located communications device is transmitting. This is an undesirable result as the GPS signals received from the satellites are weak and reducing the sensitivity of the GPS receiver further reduces the operability of the system. Additionally, the filter would also occupy space, and add cost to the unit.

Another approach in dealing with the effects of co-located communications device is overcome by the use of a high linearity LNA. This ensures that the LNA is capable of amplifying the GPS signal despite the presence of a large interfering locally generated transmission. The disadvantage of this solution is that such an LNA would consume additional power, which is not acceptable in a portable battery powered device such as a cellular telephone. A filter following the LNA would also be required to provide sufficient rejection of the interfering signal to prevent overload of the next stage of the receiver, typically a mixer. These additional performance requirements increase the size, power consumption and cost of the filter and make implementing a highly integrated receiver design without the additional filter difficult.

There are several prior art schemes that further deal with minimizing the effects of a cellular transceiver and antenna on the GPS receiver operation by blanking GPS signals during operation or transmission of radio receiver signals. These systems are implemented by sending a blanking signal to the GPS receiver upon detecting the presence of a jamming signal outside of the GPS receiver. This does however increase the complexity of system integration as an appropriate dynamic blanking signal needs to be provided.

It is therefore an object of the invention to provide a relatively efficient method for minimizing the effect of interfering transmission without blanking the automatic gain control (AGC) or correlator of the GPS receiver or deactivating the GPS receiver based upon a detected interference.

SUMMARY OF THE INVENTION

In accordance with the invention there is provided a method of limiting the effect of interfering transmission on a GPS (Global Positioning System) receiver, the method comprising: in a first mode of operation, operating an AGC of the receiver in a linear state; in a second other mode of operation, operating the AGC in a non-linear state; receiving a first signal indicative of a presence of a jamming signal; and, switching the receiver from the first mode of operation to the second mode of operation, in dependence upon the first signal.

In accordance with the invention there is provided a method of limiting the effect of interfering transmission on a Global Positioning System (GPS) receiver, the method comprising: in a first mode of operation, operating an analogue to digital converter of the receiver in a multi-bit operating mode; in a second other mode of operation, operating the analogue to digital converter of the receiver in a one-bit operating mode; receiving a first signal indicative of a presence of a jamming signal; and, switching the receiver from the first mode of operation to the second mode of operation, in dependence upon the first signal being indicative of a presence of a jamming signal.

BRIEF DESCRIPTION OF THE DRAWINGS

Exemplary embodiments of the invention will now be described in conjunction with the following drawings, in which.

DETAILED DESCRIPTION OF EMBODIMENTS OF THE INVENTION

Figure 1:
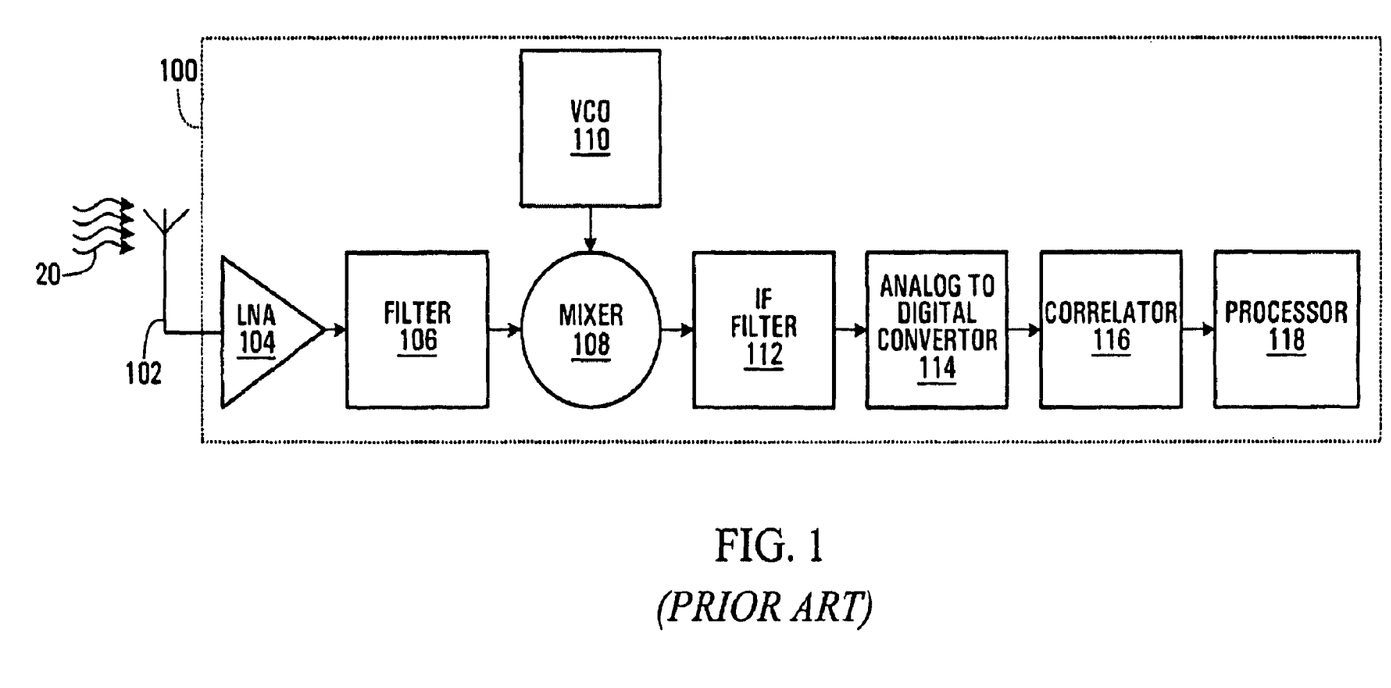
FIG. 1 is a block diagram illustrating a conventional Superheterodyne (superhet) receiver.

Referring to FIG. 1, a simplified block diagram of a conventional GPS receiver employing a Superheterodyne (superhet) architecture is shown. The superhet architecture is a common receiver front-end architecture used for mobile communication applications. In FIG. 1 the superhet architecture comprises an antenna 102, a Low Noise Amplifier (LNA) 104, an optional image-rejection filter 106, a mixer 108, a Voltage Controlled Oscillator (VCO) 100 and an Intermediate Frequency (IF) filter 112.

A radio signal 20 at the radio frequency (RF) is first received by the antenna 102 and amplified by the LNA 20. The filter 106 then optionally filters the radio signal 20. The filter is optionally obviated by integrating its function into the LNA 20 or the mixer 108. The mixer 108 down-converts the radio signal 20 from the RF to the lower IF by using a local oscillator signal LO generating by the VCO 110. At this point the radio signal 20 is now centered on a low enough frequency where it is possible to perform the back-end processing.

The transition from front-end to back-end processing relies on the radio signal 20 that has been down-converted to be filtered by the IF filter 112 and then passed to an analogue-to-digital converter (ADC) 114. The ADC 114 converts the radio signal 20 from a summation of analogue waveforms into a bit-stream of digital data for processing.

The back-end processing of received signals comprises a correlator 116 and a processor 118. GPS signals are modulated in a manner similar to CDMA transmissions, whereby pseudo-random codes are employed to identify each of the orbiting GPS satellites and aid in resolving the timing of the received GPS signals. As such the signals are processed digitally by logic, which performs a correlation function in the correlator 116. In the correlator 116 the processing gain applied to the spread spectrum GPS signal raises the signal level above the noise being received when a local copy of the code specific to individual GPS satellite is placed in-phase with the received signal modulated with the same code. This correlation and synchronization process is carried out for the GPS satellites in order to identify the strongest set of signals to be used to calculate the GPS receiver's co-ordinates. The results are then passed from the correlator 116 to the processor 118 to determine the signal path delays to each of the satellites and hence enable calculation of the location of the receiver.

When a large interference signal is present, such as from a co-located or nearby transmitter, the front-end radio circuits become overloaded and the GPS signal is corrupted, preventing the correlator 116 from obtaining useful information. As the correlator 116 cannot determine that the GPS signal is corrupted, it continues to process the received signal 20, continuing to accumulate noise, so that the ratio of useful signal to noise (SNR) is reduced.

When operating under normal signal conditions the correlated GPS signal accumulates linearly with duration, while the noise accumulates with the square root of the duration, so increasing the duration improves the desired signal-to-noise ratio (SNR). When the system is overloaded, the GPS signal is corrupted and the desired signal accumulation ceases while the noise accumulation continues to increase, resulting in a degradation of the signal-to-noise ratio.

Figure 2:
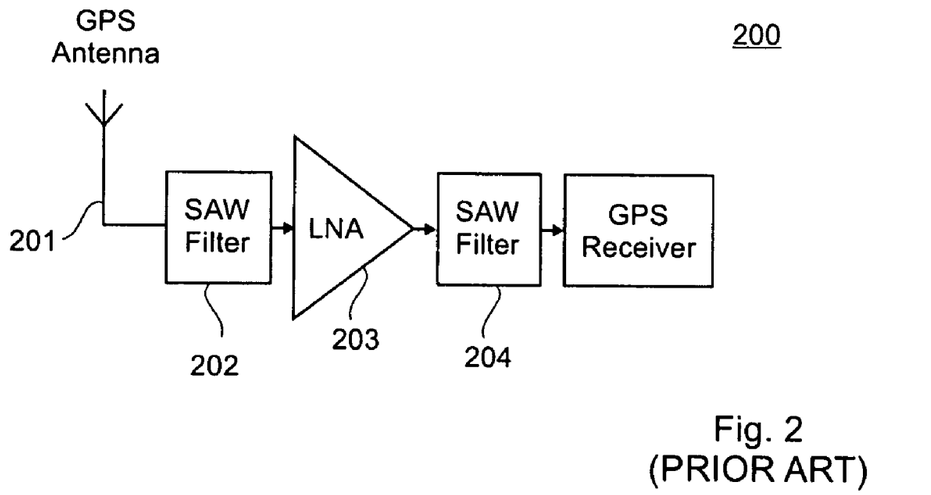
FIG. 2 illustrates a block diagram of a prior art GPS receiver having a GPS Surface Acoustic Wave (SAW) filter.

FIG. 2 illustrates a block diagram of a prior art GPS receiver having a GPS Surface Acoustic Wave (SAW) filter. The system 200 comprises a GPS antenna 201, a SAW filter 202 as the first element, a low noise amplifier (LNA) 203 followed by another SAW filter 204. Consider for example, the effect of GSM interference on the GPS receiver of the system 200. In this case, it is assumed that the transmit power of a GSM radio is +34 dBm, and considering that the SAW filter 202 and the GPS antenna 201 provide about 54 dBm of isolation, the LNA is then blocked with approximately −20 dBm of GSM power. This is disadvantageous since a high linearity LNA requiring a high supply current will be required to withstand the −20 dBm signal is without compressing the wanted GPS signal. Even if this is provided, a second SAW filter 204 is typically required to further attenuate the interferer sufficiently for the remainder of the GPS system to operate normally. Another disadvantage of this system is the insertion loss of typically 0.5~2.0 dB introduced by placing the first SAW filter 202 in front of the LNA.

Figure 3A:
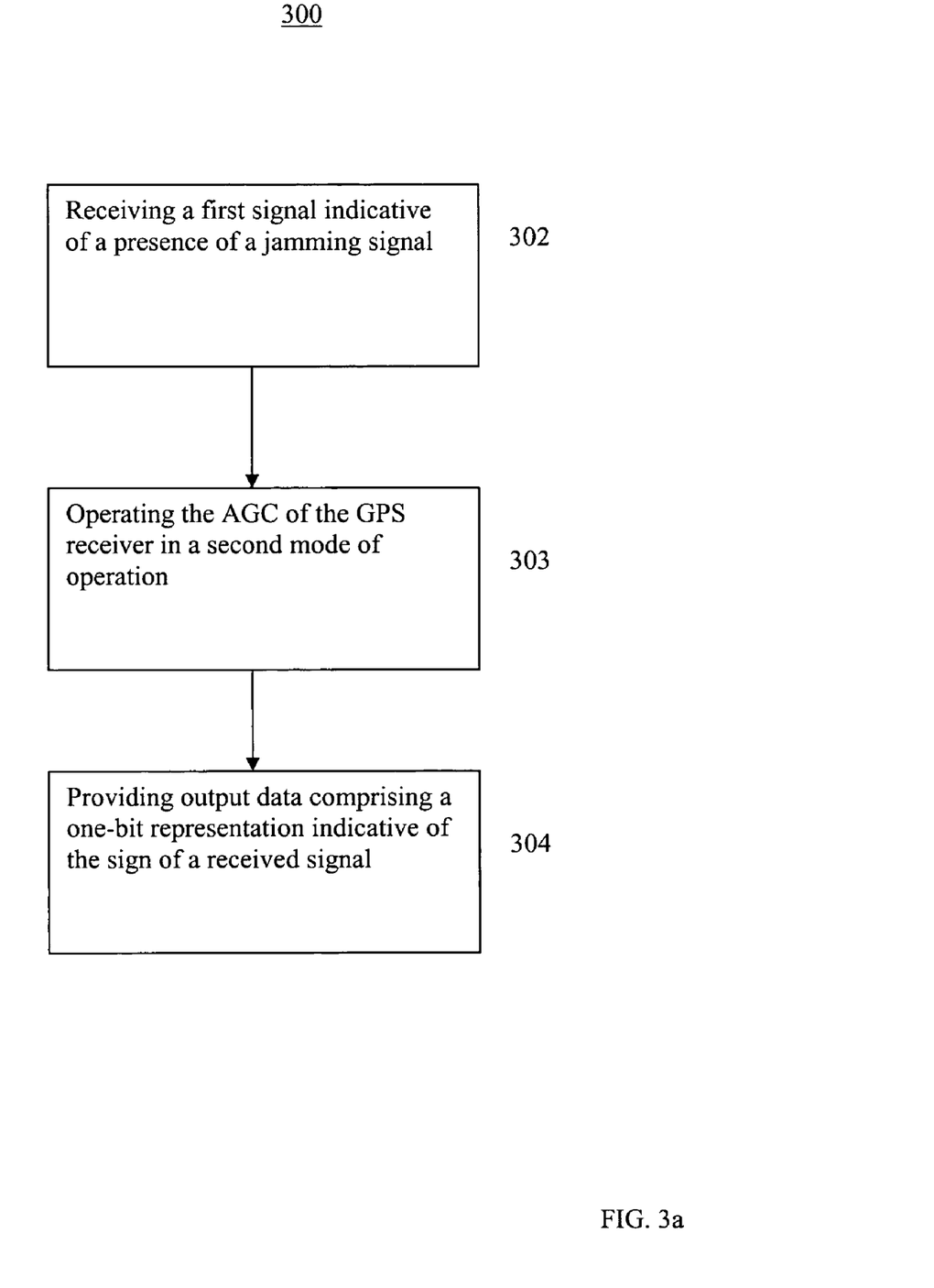
FIGS. 3*a* and 3*b* illustrate generalized process diagrams for minimizing the effects of co-located interference.
Figure 3B:
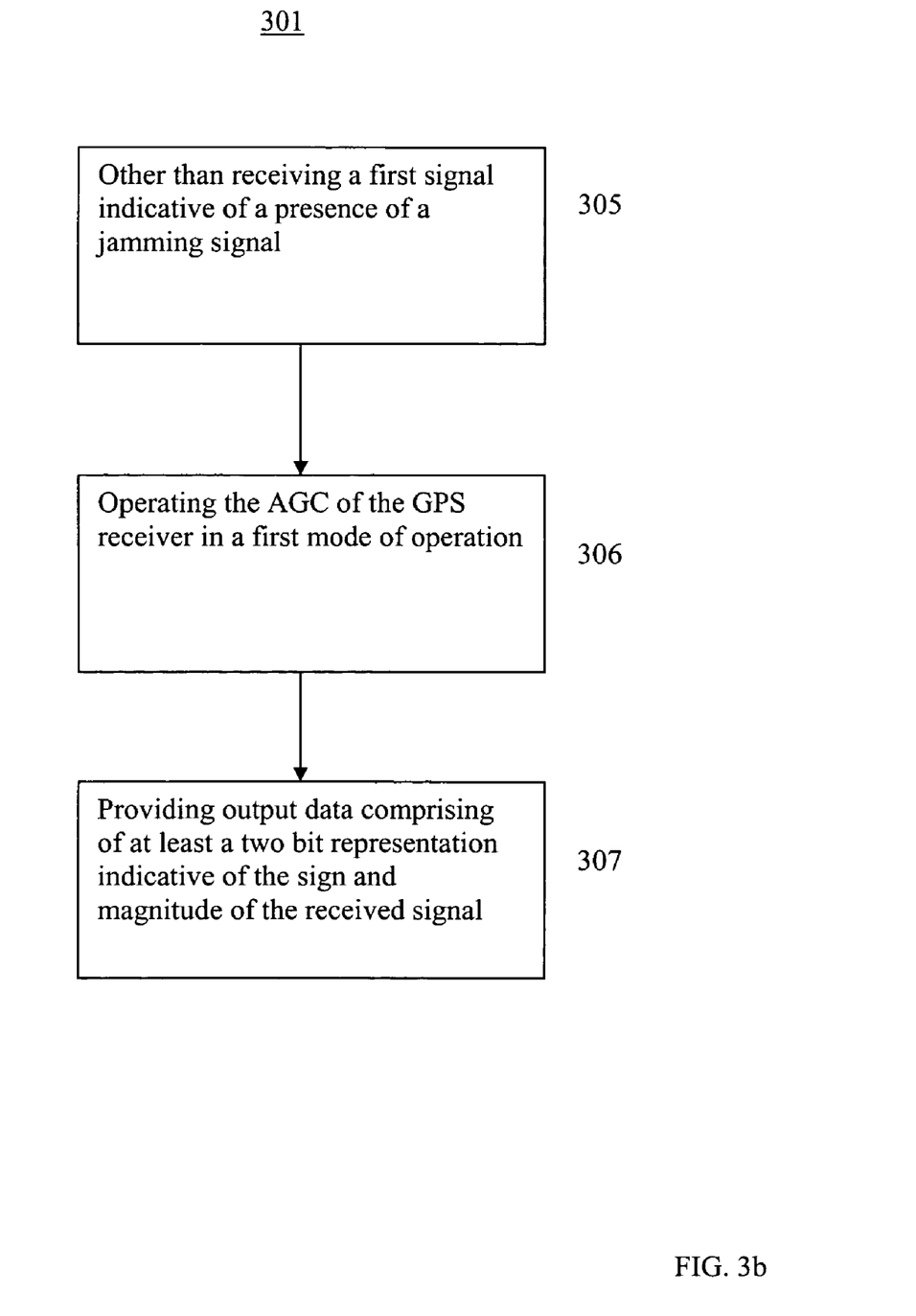

FIG. 3a and FIG. 3b illustrate processes 300 and 301 according to an embodiment of the invention, for minimizing the effect of interference on the GPS receiver where there is absent the SAW filter illustrated in FIG. 2. In the exemplary process 300, a software-generated signal indicative of the presence of a jamming signal 302 is received. The software-generated signal 302 for a mobile handset also referred to as a "transmit enable" signal denotes that a call is in session. In known applications, when such interference is present, overload of the GPS receiver causes the automatic gain control (AGC) loop in the GPS receiver to be disturbed. Typically, the AGC is used to adjust the gain of the received signal to power levels suitable for processing by the GPS receiver. In existing GPS receivers, since the received signal strength is increased due to the coupling of the cellular telephone antenna with the GPS antenna, and the AGC attempts to compensates for this increased signal strength, the AGC circuit loop is disturbed. Consequently, when the interference has subsided, the GPS receiver gain is incorrect for normal operation and the AGC takes a long time to recover such that the output signal is degraded.

As per the current embodiment of the invention, once the software-generated signal is received that the cellular transceiver is in transmit mode, then the GPS receiver is operated in "SIGN" mode 303. In this mode 303, the AGC amplifier is set to a fixed gain, typically approximately a maximum gain, and additionally the ADC operates in a non-linear state and quantizes the signal depending on whether the signal is positive or negative and produces a digitized signal 304 with 1 bit, logic "0" if negative and logic "1" if positive. Alternatively, other representations are possible which achieve the same purpose. This mode achieves a very fast receiver recovery time after an overload, at the expense of a performance hit estimated at 0.7 dB for a typical correlator design. The value of this fast recovery time is that in this mode, the received GPS data is only corrupted during those periods when the interfering transmitter is actually active, and good GPS data will be received during periods when the transmitter is idle.

Alternatively, the AGC amplifier as depicted in FIG. 1 is reconfigured as a limiting amplifier when a software-generated signal indicative that a transmission is occurring is received. In this case, the AGC does not make any adjustment to gain and as such recovers much more quickly, for example within 10 usec.

Typically when a co-located transmitter is using a GSM cellular standard, and is turned on for a burst period corresponding to one slot in a frame of 8 slots, the GPS data received during the active slot is unavailable. Since the current standard operates using a time division multiplexed signal, a GPS processor previously had to recover during each frame resulting in a reduced amount of GPS data being available for GPS processing. According to some of the above embodiments, valid GPS data is available for the entire frame.

In the example above, although noise is accumulated during the transmit burst, causing approximately 1.2 dB of SNR reduction for 1:8 duty cycle, no further mitigation is necessary. This is further illustrated in FIGS. 4a and 4b.

When the software-generated signal that a transmission is occurring is other than received 305, the GPS receiver is operated in "SIGN/MAG" mode 306 for full GPS performance. In this case, the AGC of the GPS receiver operates linearly and controls gain applied to GPS signals such that a controlled output level is achieved. As such, the output data of the ADC is typically a two-bit configuration 306 denoted as logic 00, 01, 10, 11. Where one of the bits referred to as the SIGN bit is high or low depending on whether the signal is positive or negative while MAG the second bit is high when the absolute magnitude of the signal is greater than a threshold. In the "SIGN/MAG" mode of operation, an overload condition disturbs the AGC setting so that when the interference has subsided, the receiver gain is incorrect for normal operation. Since AGC recovery time is relatively slow, there is a period of several milliseconds before the AGC loop settles to the correct gain allowing the correlators to settle. As such, with an active AGC remaining in a same mode throughout a frame when a transmit GSM interference occurs, the GPS operation for much of the frame does not result in useful data. Conversely, there exists a tradeoff such that this mode of operation provides a superior SNR of approximately 0.7 dB during normal operation where the interference does not exist. This improved SNR is due to a more precise quantization in "SIGN/MAG" mode in comparison to the one-bit representation of the received signal within the "SIGN" mode.

Alternatively, the number representation in linear mode is not limited to SIGN/MAG. Alternative 2-bit and multi-bit encoding schemes are useful including 3 bit, 4 bit, grey-coded, offset binary and two's complement versions of these.

Figure 4A:
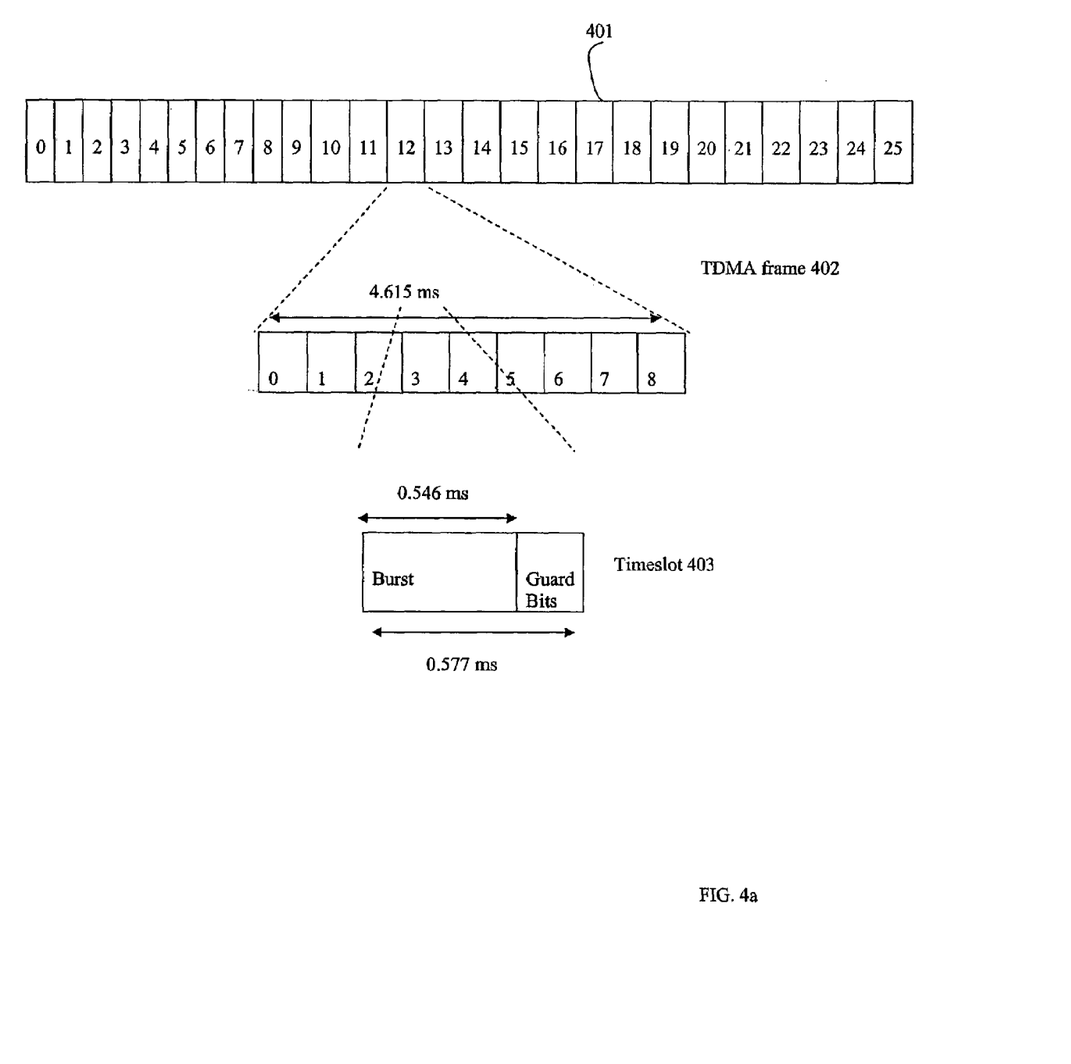
FIGS. 4*a* and 4*b* illustrate an exemplary timing diagram according to an embodiment of the present invention.

FIG. 4a illustrates an exemplary timing diagram of a GSM transmission system. Shown in FIG. 4a is a multi-frame sequence 401 transmission for use in a GSM system. Within the multi-frame sequence 401, are a plurality of frequency channels numbered 0 to 25. Each frequency channel comprises a TDMA frame 402 of duration 4.615 ms and is segmented into 8 equally divisible time slots 403 of duration 0.577 ms. A particular time slot of the eight equally divisible time slots occurs every 4.615 ms. Typically in order to allow for alignment errors, a data transmission burst for use with GSM is less than ⅛ of the TDMA frame by a small amount.

Figure 4B:
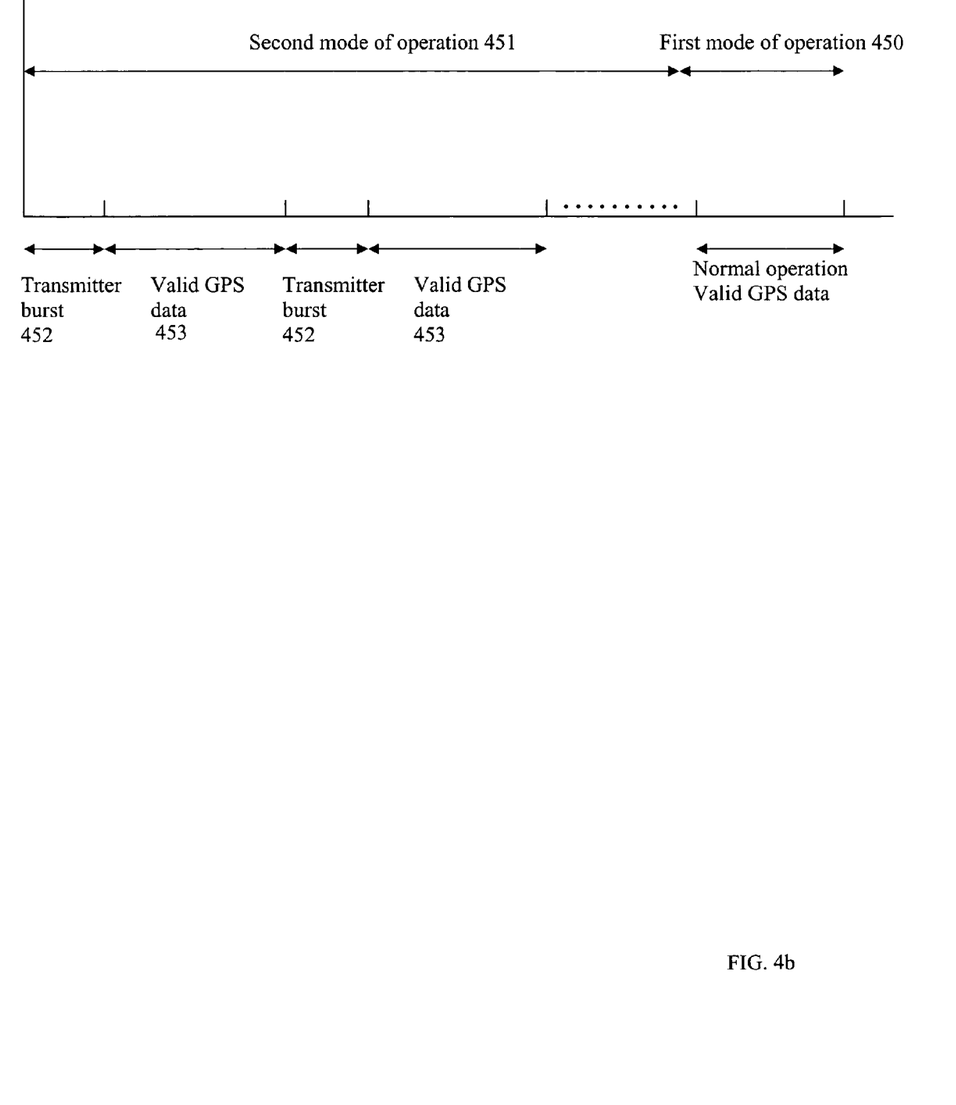

FIG. 4b illustrates an exemplary timing diagram according to an embodiment of the invention using GSM transmission similar to that illustrated in FIG. 4a. At 451, a second mode of operation is shown. Here, a periodic transmitter burst 452 occurs alternating with valid GPS data 453 in the absence of further jamming signals or noise. Because of the simplicity of determining a mode of operation with software in dependence upon the presence of a jamming transmission, the timing diagram does not benefit from switching between modes during a single frame. Conversely, because of the nature of the second mode of operation 451, valid GPS data 453 is acquired for a majority of a duration of each frame. Typically valid GPS data is received for approximately ⅞ of the entire frame in GSM transmission. Once the jamming transmission has ended as indicated by software, the first mode of operation 450 results, wherein the software-generated signal indicating that the jamming transmission is occurring is other than received and the GPS receiver is operated in "SIGN/MAG" mode. Conversely, as described above, in the second mode of operation 451, the software-generated signal that a transmission is occurring is received and the GPS receiver is operated in "SIGN" mode.

Figure 5:
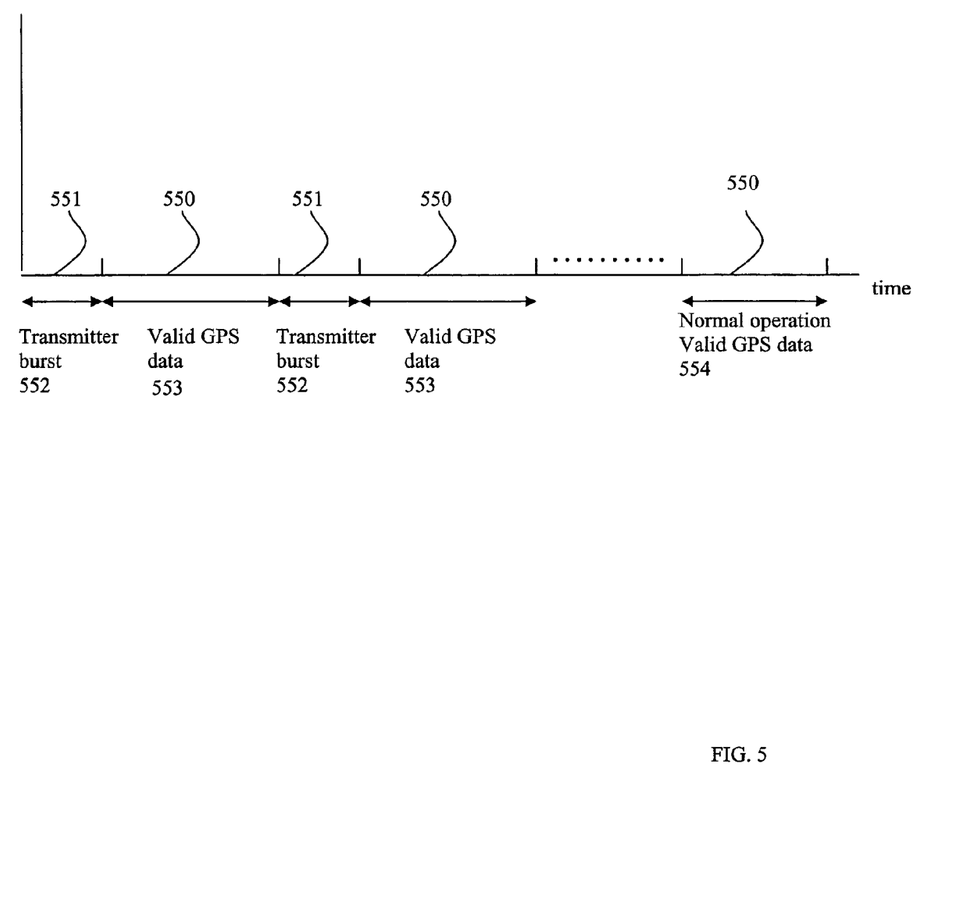
FIG. 5 is a simplified timing diagram reflective of normal operation of a transmitter in burst mode operation.

FIG. 5 illustrates an exemplary timing diagram according to an embodiment of the invention using GSM transmission. During a duration of the presence of a jamming signal, periodic transmitter bursts 552 occur alternating with valid GPS data 553 in the absence of further jamming signals or noise. Upon receiving a first software-generated signal indicating the presence of a jamming transmission, and upon receiving a second signal indicating the presence of the periodic transmitter burst 552 within the jamming transmission, the GPS receiver is operated in a second mode of operation 551. The second mode of operation referring to the "SIGN" mode of operation previously discussed in relation to other embodiments of the invention.

Because of the simplicity of determining a mode of operation with software in dependence upon the presence of a jamming transmission, the timing diagram does not benefit from switching between modes during a single frame.

During a duration wherein the presence of the software-generated signal is detected and the presence of the second signal is other than detected, the GPS receiver is operated in a first mode of operation 550. The first mode of operation referring to the "SIGN/MAG" mode of operation allowing for valid GPS data 553 to be acquired outside the occurrence of transmitter bursts 552.

Typically valid GPS data is received for approximately ⅞ of the entire frame in GSM transmission. Once the jamming transmission has ended and the software-generated signal indicating the presence of jamming is other than received, the first mode of operation 550 results again.

Alternatively, a hardware signal is provided relating to a presence of a jamming signal. Such a hardware signal allows for accurate switching between the first mode of operation and the second mode of operation. Further alternatively, a software-generated signal and a hardware signal are used in conjunction one with another to facilitate switching between modes based on both a presence of a jamming signal and a presence of a transmission in progress.

Alternatively, the embodiments above are applied to minimizing the effect of other transmitters on GPS receivers including Time Division Multiple Access (TDMA) and General Packet Radio Service GPRS or EDGE transmitters.

Numerous other embodiments may be envisaged without departing from the spirit or scope of the invention.

What is claimed is:

1. A method of limiting the effect of interfering transmission on a Global Positioning System (GPS) receiver, the method comprising:
    in a first mode of operation, operating an AGC of the receiver in a linear state;
    in a second other mode of operation, operating the AGC in a non-linear state;
    receiving a first signal indicative of a presence of a jamming signal; and,
    switching the receiver from the first mode of operation to the second mode of operation, in dependence upon the first signal.

2. A method according to claim 1, comprising:
    providing a mobile handset having a transmitter with a duty cycle, collocated with the GPS receiver, and
    wherein the first signal is for indicating a call is in session on the mobile handset.

3. A method according to claim 2, wherein the AGC is operated in the second other mode for an entire duration of a call.

4. A method according to claim 2, wherein the AGC is operated in the second other mode for a portion of each frame during the entire duration of a call, the portion less than the whole frame.

5. A method according to claim 2, comprising:
detecting the presence of a jamming signal in the GPS receiver and providing the first signal based on the detected presence.

6. A method according to claim 5, wherein the presence of the jamming signal is detected by detecting a signal level received at the GPS receiver.

7. A method according to claim 1, absent a surface acoustic wave (SAW) filter for filtering co-located interference.

8. A method according to claim 2, wherein in the first mode of operation:
the AGC loop automatically varies a gain of a received signal; and
an analog-to-digital converter of the receiver produces output data comprising at least a two bit value representative of the sign and magnitude of the received signal.

9. A method according to claim 8, wherein the at least a two bit value comprises one of a three bit, a four bit, a grey coded, an offset binary and two's complement representation of the received signal.

10. A method according to claim 8, wherein in the second mode of operation, the analog-to-digital converter provides a one-bit representation of the received signal, the one-bit representation indicative of the sign of the received signal.

11. A method according to claim 10, wherein in the second mode of operation, the receiver gain is fixed.

12. A method according to claim 1, wherein in the second mode of operation, the analog-to-digital converter provides a one-bit representation of the received signal, the one-bit representation indicative of the sign of the received signal.

13. A method according to claim 2, wherein in the second mode of operation, the AGC amplifier of the receiver is operated as a limiting amplifier.

14. A method according to claim 2, comprising:
detecting a transmitter burst during the duration of the first signal; and,
providing a second signal in dependence upon the detected transmitter burst.

15. A method according to claim 14, comprising:
operating the receiver in the second mode of operation in response to the second signal being indicative of a detected transmitter burst;
operating the receiver in a first mode of operation in response to the first signal when there is other than a second signal indicative of a presence of a transmitter burst.

16. A method according to claim 14, comprising:
operating the receiver in the second mode of operation in response to the second signal being indicative of a detected transmitter burst;
operating the receiver with a gain of the AGC within a first range, the first range suitable for use in the absence of interference.

17. A method according to claim 10, comprising:
maintaining a gain of the AGC at a level suitable for use in the absence of strong interference when the first signal is indicative of a presence of a jamming signal, for supporting operation of the AGC when the presence of a jamming signal is other than detected.

18. A method according to claim 10, wherein a recovery time for the AGC is substantially greater than a recovery time for a correlator circuit of the GPS receiver.

19. A method of limiting the effect of interfering transmission on a Global Positioning System (GPS) receiver, the method comprising:
in a first mode of operation, operating an analogue to digital converter of the receiver in a multi-bit operating mode and an AGC of the receiver in a first linear state of operation;
in a second other mode of operation, operating the analogue to digital converter of the receiver in a one-bit operating mode and the AGC of the receiver in a second non-linear state of operation;
receiving a first signal indicative of a presence of a jamming signal; and,
switching the receiver from the first mode of operation to the second mode of operation, in dependence upon the first signal being indicative of a presence of a jamming signal.

20. A system for limiting the effect of interfering transmission on a Global Positioning System (GPS) receiver, the system comprising:
an input port for receiving a first signal, the first signal indicative of a presence of a jamming signal;
an AGC circuit operable in a first linear mode of operation and a second non-linear mode of operation;
a controller circuit for receiving the first signal and for switching the AGC between the first linear mode of operation and the second non-linear mode of operation at least in dependence upon the received first signal.

21. A system according to claim 20, comprising:
a mobile transmitter having a transmit duty cycle, collocated with the system, and
wherein the first signal is for indicating a call is in session on the mobile handset.

22. A system according to claim 20, comprising timing circuitry for switching the AGC circuit between modes during a duration of a same call in dependence upon the duty cycle.

23. A system according to claim 20, comprising a detector for detecting the presence of a jamming signal and providing the first signal based on the detected presence.

24. A system according to claim 20, absent a surface acoustic wave (SAW) filter for filtering co-located interference.

25. A system according to claim 20, wherein in the first linear mode of operation, the analog-to-digital converter provides one of a three bit, a four bit, a grey coded, an offset binary and two's complement representation of the received signal.

26. A system according to claim 20, wherein in the second non-linear mode of operation, the analog-to-digital converter provides a one-bit representation of the received signal, the one-bit representation indicative of the sign of the received signal.

27. A system according to claim 20, wherein in the second non-linear mode of operation, the receiver gain is fixed.

28. A system for limiting the effect of interfering transmission on a Global Positioning System (GPS) receiver; the system comprising:
an input port for receiving a first signal, the first signal indicative of a presence of a jamming signal;
an ADC circuit operable in each of two modes of operation, a first mode having multi-bit operation and a second mode having one-bit operation;

an AGC operable in each of two modes of operation, a first mode having a linear mode of operation and a second non-linear mode of operation;

a controller circuit for receiving the first signal and for switching at least one of the ADC and AGC between the first mode and the second mode in dependence upon the received first signal.

29. A system according to claim 28, comprising:

a mobile transmitter having a transmit duty cycle, collocated with the GPS receiver, and wherein the first signal is for indicating a call is in session on the mobile handset.

30. A system according to claim 29, comprising:

timing circuitry for switching the GPS receiver between modes during a duration of a same call in dependence upon a portion of a frame during which data transmission occurs.

31. A system according to claim 28, comprising:

a detector for detecting the presence of a jamming signal in the GPS receiver and providing the first signal based on the detected presence.

32. A system according to claim 28, absent a surface acoustic wave (SAW) filter for filtering co-located interference.

33. A system according to claim 28, wherein in the first mode of operation, the analog-to-digital converter provides one of a three bit, a four bit, a grey coded, an offset binary and two's complement representation of the received signal.

34. A system according to claim 28, wherein in the second mode of operation, the receiver gain is fixed.

35. A computer readable medium having data stored therein according to a predetermined computing device format, and upon execution of the data by a suitable computing device a system for limiting the effect of interfering transmission on a Global Positioning System (GPS) receiver is provided comprising:

an input port for receiving a first signal, the first signal indicative of a presence of a jamming signal;

an AGC circuit operable in a first linear mode of operation and a second non-linear mode of operation;

a controller circuit for receiving the first signal and for switching the AGC between the first and the second mode of operation in dependence upon the received first signal.

36. A computer readable medium having data stored therein according to a predetermined computing device format, and upon execution of the data by a suitable computing device a system for limiting the effect of interfering transmission on a Global Positioning System (GPS) receiver is provided comprising an input port for receiving a first signal, the first signal indicative of a presence of a jamming signal;

an AGC operable in each of two modes of operation, a first mode having a linear mode of operation and a second non-linear mode of operation;

a controller circuit for receiving the first signal and for switching at least one of the ADC and AGC between the first mode and the second mode in dependence upon the received first signal.

* * * * *